(12) United States Patent
Takeda et al.

(10) Patent No.: US 7,394,108 B2
(45) Date of Patent: Jul. 1, 2008

(54) LIGHT-EMITTING DEVICE AND VEHICLE LAMP

(75) Inventors: Hitoshi Takeda, Shizuoka (JP); Tsukasa Tokida, Shizuoka (JP)

(73) Assignee: Koito Manufacturing Co., Ltd., Minato-Ku, Tokyo (JP)

( * ) Notice: Subject to any disclaimer, the term of this patent is extended or adjusted under 35 U.S.C. 154(b) by 437 days.

(21) Appl. No.: 11/286,635

(22) Filed: Nov. 23, 2005

(65) Prior Publication Data
US 2006/0108597 A1     May 25, 2006

(30) Foreign Application Priority Data
Nov. 25, 2004   (JP)   ............... 2004-340131

(51) Int. Cl.
*H01L 33/00*   (2006.01)
(52) U.S. Cl. .................. 257/99; 257/100; 257/106
(58) Field of Classification Search .............. 257/79, 257/81, 82, 84, 88, 98–100, 106
See application file for complete search history.

(56) References Cited
U.S. PATENT DOCUMENTS
5,914,501 A  *  6/1999  Antle et al. .................. 257/99

FOREIGN PATENT DOCUMENTS
JP       2004-51014       2/2004

OTHER PUBLICATIONS
Patent Abstracts of Japan, Publication No. 2004-051014 dated Feb. 19, 2004, 2 pages.

* cited by examiner

*Primary Examiner*—Thien F Tran
(74) *Attorney, Agent, or Firm*—Osha Liang LLP

(57) ABSTRACT

A light-emitting device in which a light-emitting element, such as an LED, and an electrostatic protection element for protecting the light-emitting element from electrostatic breakdown are connected in parallel. The light-emitting device is configured such that a connection wire member of the light-emitting element and a connection wire member of the electrostatic protection element are formed of the same material; and the connection wire member of the electrostatic protection element is smaller in diameter than the connection wire member of the light-emitting element. When the light-emitting element lapses into an open-circuit state, whereby an electric current which is originally intended to flow through the element unintentionally flows through the electrostatic protection element, the connection wire member is fused by an overcurrent. Consequently, occurrence of a failure of the electrostatic protection element in a short-circuit mode can be prevented.

20 Claims, 4 Drawing Sheets

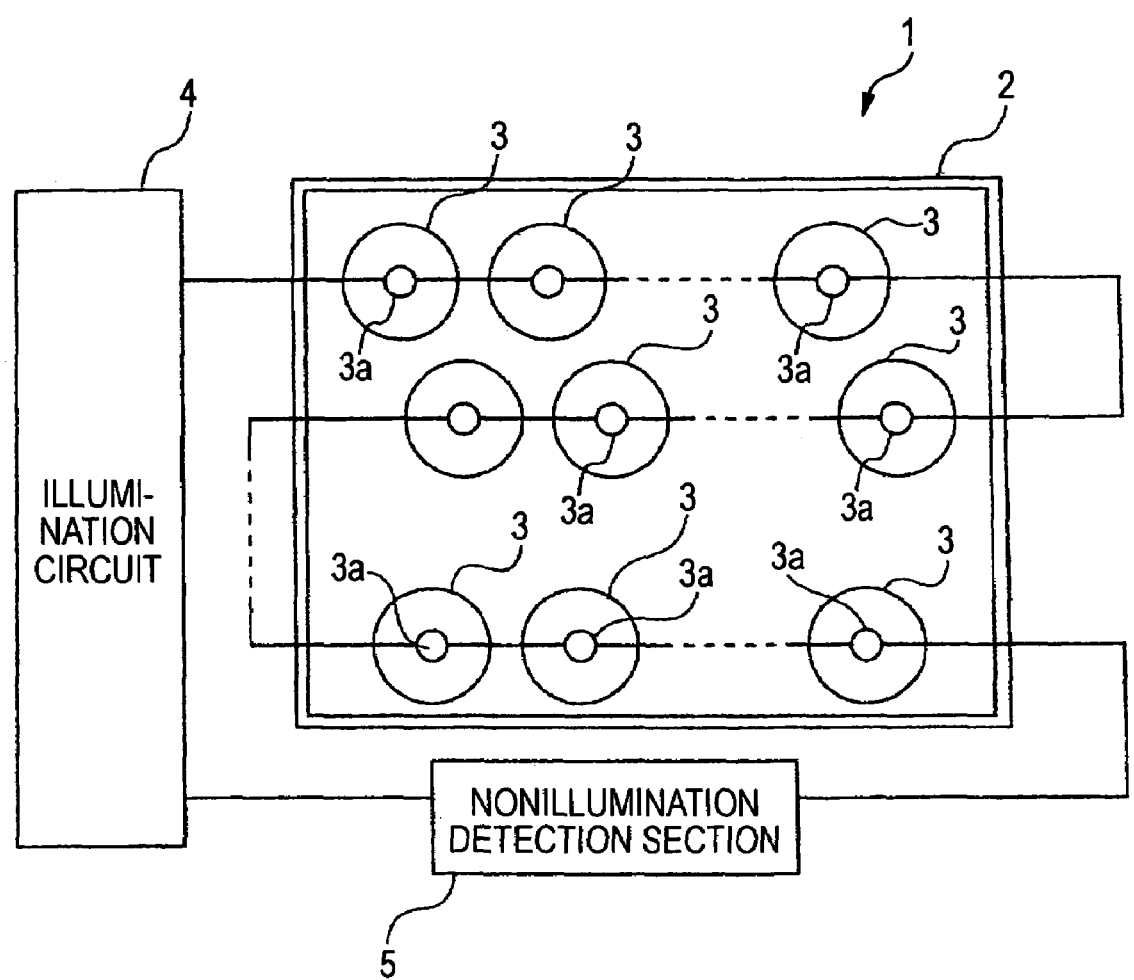

— : GOLD WIRING PORTION
— : SUBSTRATE PATTERN PORTION

LIGHT-EMITTING DEVICE AND VEHICLE LAMP

BACKGROUND OF INVENTION

1. Field of the Invention

The present invention relates to a technique for a light-emitting device, which includes a light-emitting element and an electrostatic protection element for protecting the light-emitting element from electrostatic breakdown, as well as for a vehicle lamp including use of the light-emitting device. The technique enables reliable detection of a nonillumination state of the light-emitting device.

2. Background Art

In a light-emitting device employed as a light source of a lamp, an electrostatic protection element, such as a Zener diode or a capacitor, is disposed in parallel with a light-emitting chip of the light-emitting device as a measure against static electricity of the light-emitting chip. For instance, known configurations of a white light-emitting diode (LED) employing a nitride semiconductor material, or the like, for its LED chip, include that in which a Zener diode is connected in parallel with the LED chip, thereby packaging the Zener diode and the LED chip into a single package so as to prevent electrostatic breakdown of the element. More specifically, the Zener diode and the LED chip are disposed in a single package in a state where a cathode of the LED chip and an anode of the Zener diode are connected together, and an anode of the LED chip and a cathode of the Zener diode are connected together.

Electric connection between the LED chip and the Zener diode is established through bonding with use of gold wire having the same diameter.

In a configuration in which a plurality of light-emitting devices (or light-emitting modules), each device including a light-emitting element and an electrostatic protection element, are connected in parallel to thus serve as a light source, a lapse of even any one of the light-emitting elements into an illumination-disabled state problematically affects optical performance (degradation in light distribution performance, or the like, in the case of application to a light source for a vehicle). Therefore, nonillumination detection of the respective light-emitting devices is required. For instance, the following nonillumination detection method is applied to a configuration in which all the light-emitting elements are connected in series, and the light-emitting elements are driven through its constant current control.

(I) A method of monitoring current values of a light-emitting device group; and (II) a method of monitoring voltage values across the respective light-emitting devices.

In these cases, since a generally assumed failure is that of the light-emitting element in an open-circuit mode, detection of a failure in a short-circuit mode may fail (that is, during a short-circuit mode of a light-emitting element or an electrostatic protection element, a nonillumination state may fail to be detected). Accordingly, possibility of occurrence of a nonillumination state of a light-emitting device resulting from a failure in a short-circuit mode must be minimized.

SUMMARY OF INVENTION

Since the related-art configuration fails to provide sufficient countermeasures against faults of an electrostatic protection element in a short-circuit mode, there arises a problem of reliable detection of a nonillumination state of a light-emitting device being prevented.

For instance, when an LED chip is caused to lapse into an open-circuit mode by some cause in a configuration in which the LED chip and a Zener diode are employed, the rated current of the LED chip flows through the Zener diode. When the rated current is an overcurrent for the Zener diode and induces a failure of the Zener diode in a short-circuit mode, a short-circuit state is generated in the light-emitting device in its entirety.

According to method (I), an electric current does not flow when the Zener diode is in an open-circuit mode. Accordingly, occurrence of a failure of any one of the light-emitting device in an open-circuit mode can be detected. However, during a period of failure of the Zener diode in a short-circuit mode, an electric current flows. Therefore, sufficient detection cannot be attained by means of only monitoring the current values.

Method (II) cannot ensure detection accuracy in the following cases: when a voltage value of the Zener diode during a period of failure of the same in a short-circuit mode cannot be distinguished from a voltage value across the LED chip during normal illumination thereof; or when discrimination between the two voltage values is insufficient.

Forming a nonillumination detection system by means of combining methods (I) and (II), or by means of employing another method for further enhancing the detection accuracy, or the like, is also conceivable. However, there remain problems in terms of influences on an increase in complexity of the circuit configuration, a cost increase, and the like.

To this end, the invention aims at minimizing a possibility of occurrence of a failure of an electrostatic protection element, which is—to be connected to a light-emitting element in parallel, in a short-circuit mode.

Embodiments of the present invention provide a light-emitting device which includes a light-emitting element, and an electrostatic protection element for protecting the light-emitting element from electrostatic breakdown, and which is configured such that the light-emitting element and the electrostatic protection element are connected in parallel. The light-emitting device is characterized in that a connection wire member of the light-emitting element and a connection wire member of the electrostatic protection element are formed of the same material; and the connection wire member of the electrostatic protection element is smaller in diameter than the connection wire member of the light-emitting element.

Embodiments of the present invention also provide a vehicle lamp including a light-emitting device and an optical system. The light-emitting device includes a light-emitting element, and an electrostatic protection element for protecting the light-emitting element from electrostatic breakdown, and is configured such that the light-emitting element and the electrostatic protection element are connected in parallel. The vehicle lamp is characterized in that a connection wire member of the light-emitting element and a connection wire member of the electrostatic protection element are formed of the same material; and the connection wire member of the electrostatic protection element is smaller in diameter than the connection wire member of the light-emitting element.

Hence, according to embodiments of the present invention, in a case where a light-emitting element is brought into an open-circuit state by some cause, whereby an electric current, which is originally intended to flow through the light-emitting element, unintentionally flows through an electrostatic protection element, a connection wire member of the electrostatic protection element is fused by an overcurrent. Consequently, occurrence of a failure of the electrostatic protection element in a short-circuit mode can be prevented.

According to embodiments of the invention, a connection wire member of an electrostatic protection element is fused before the element reaches short-circuit breakage by an overcurrent, thereby preventing the electrostatic protection element from lapsing into a failure in a short-circuit mode. In addition, the circuit configuration and a detection method for a nonillumination detection system are not increased in complexity, which is advantageous in view of lowering cost.

A fusing current in relation to the connection wire member of the electrostatic protection element is preferably set to the rated current flowing through the light-emitting element or lower. In a case where gold wire is employed as the connection wire members, the diameters thereof are to be specified such that a ratio between d1 and d2 satisfies "$0<(d1/d2)\leq(1/2)$," wherein d1 represents a diameter of the connection wire member of the electronic protection element, and d2 represents a diameter of the connection wire member of the light-emitting element. By virtue of this configuration, the connection wire member of the electrostatic protection element is fused before an overcurrent which flows during an open-circuit period of the light-emitting element causes the electrostatic protection element to lapse into a short-circuit state. Therefore, occurrence of a failure of the electrostatic protection element in a short-circuit mode can be prevented.

In addition, when a Zener diode is employed as the electrostatic protection element, occurrence of a failure of the Zener diode in a short-circuit mode can be prevented.

When embodiments of the present invention are applied to a vehicle lamp having a light-emitting device, which includes a light-emitting element and an electrostatic protection element, and an optical system for obtaining illumination light by use of the light-emitting device as a light source, nonillumination of the light-emitting device can be detected without fail. Accordingly, a countermeasure (displaying a result of nonillumination detection, issuing an alarm for urging replacement of the light source, or the like) can be taken, thereby preventing influences which may otherwise exerted on illumination, such as degradation in light distribution performance. Other aspects and advantages of the invention will be apparent from the following description and the appended claims.

BRIEF DESCRIPTION OF DRAWINGS

FIG. 1 is an explanatory view illustrating an example configuration of a vehicle lamp according to the present invention;

DETAILED DESCRIPTION

Figure 2A:
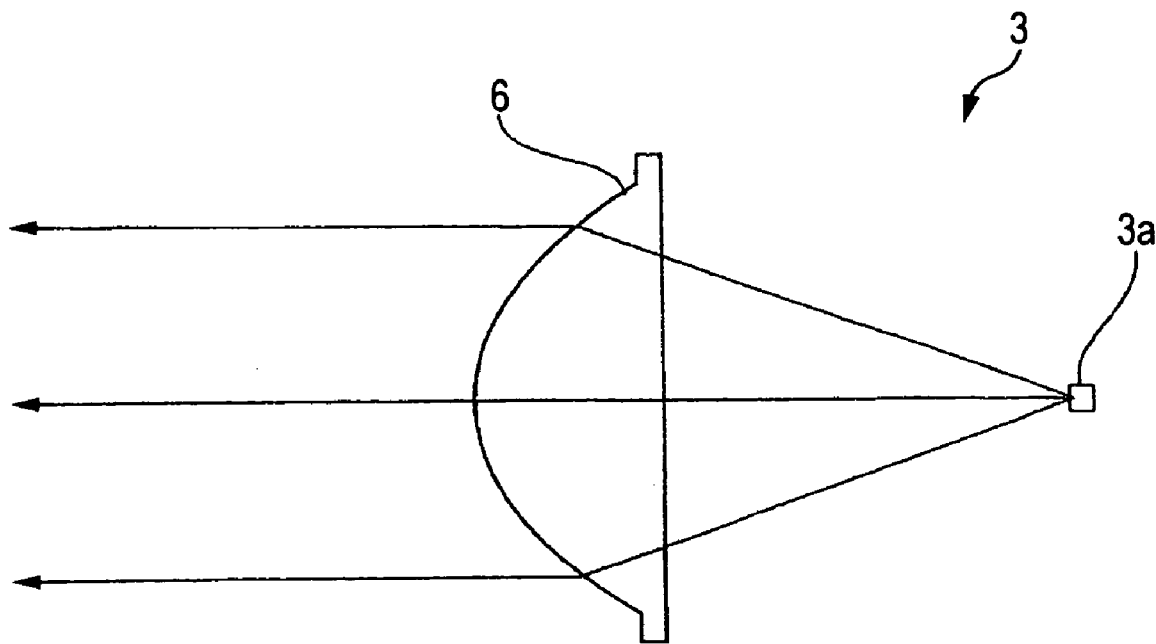
FIGS. 2A and 2B are views for explaining the configuration of a light source unit.

The present invention aims at enabling reliable detection of a nonillumination state of a light-emitting device, such as a light-emitting diode in application to a lamp, a traffic light, or the like.

FIG. 1 is a schematic explanatory view illustrating an example configuration of a vehicle lamp according to the present invention. A vehicle lamp 1 has, in a lamp body 2 thereof, a plurality of light source units 3, which are disposed with a predetermined spacing therebetween.

Each of the light source units has a light-emitting device 3a; and each of the light-emitting devices 3a includes a light-emitting element and an electrostatic protection element for the light-emitting element. The light source units 3 (the light-emitting devices 3a) are connected in series, and configured so as to receive power supply from an illumination circuit (or a power supply section) 4.

A nonillumination detection section 5 is disposed for detecting an electric current flowing through a serial circuit constituted of the light-emitting devices 3a, thereby determining whether or not any one of the light-emitting devices has lapsed into a nonillumination state. A result of the determination is used for a status display, an alarm, or the like. Those skilled in the art will appreciate that the invention is not limited to the above-described method (I), and there may be adopted another method of monitoring voltage values across the light-emitting devices, as in the case of the method (II).

Figure 2B:
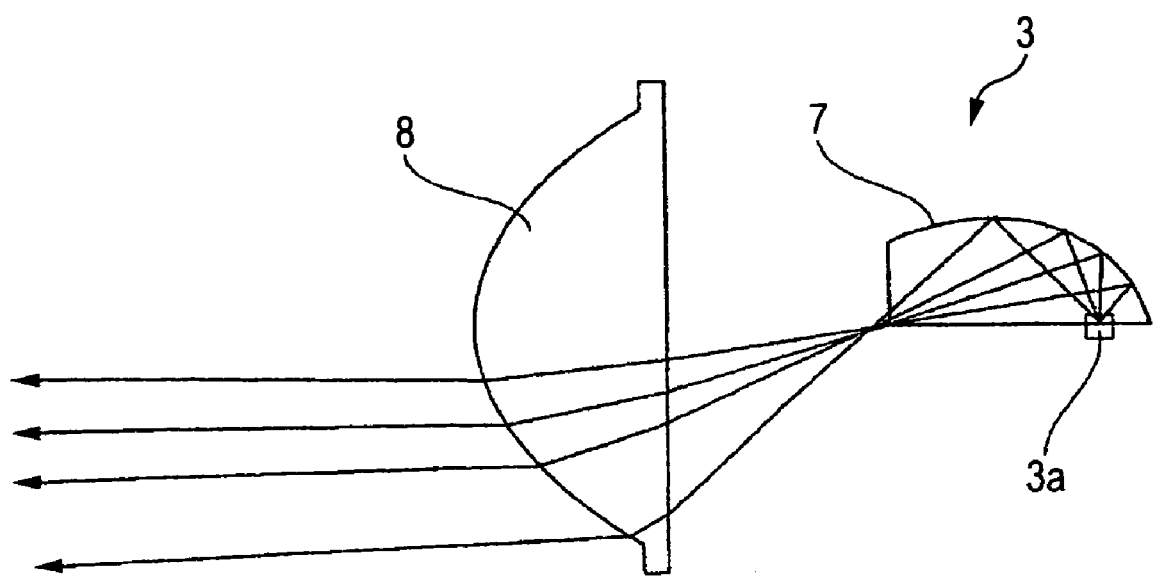

FIGS. 2A and 2B illustrate example configurations of the light source unit 3. FIG. 2A illustrates a mode of utilizing direct light originating from the light-emitting device 3a, and FIG. 2B illustrates a mode of utilizing light originating from the light-emitting device 3a and thereafter reflected from a reflection mirror.

In FIG. 2A, a light-emitting element (a light-emitting section) of the light-emitting device 3a is disposed at substantially a position of a focal point of a projection lens 6. Light originating from the light-emitting element within the light-emitting device 3a is illuminated to the outside through the projection lens 6.

FIG. 2B illustrates the configuration including use of the light-emitting device 3a and a reflection mirror 7. Light originating from the light-emitting element within the light-emitting device 3a, which is located at substantially a position of a focal point of the reflection mirror 7, is reflected from an inner face (a reflection face) of the reflection mirror 7, and thereafter illuminated to the outside through a projection lens 8.

The projection lens 6, 8 forms an optical system for obtaining illumination light by use of the light-emitting device as a light source, and light exiting from each of the light source units is illuminated to the outside of the lamp through an unillustrated outer lens.

Examples of applicable configurations of the embodiment for obtaining a desired light distribution performance include: a configuration in which a plurality of light source units of a direct-projection type as illustrated in FIG. 2A are employed; a configuration in which a plurality of light source units of a reflection type as illustrated in FIG. 2B are employed; and a configuration in which a plurality of light sources of the two types are combined.

Figure 3:
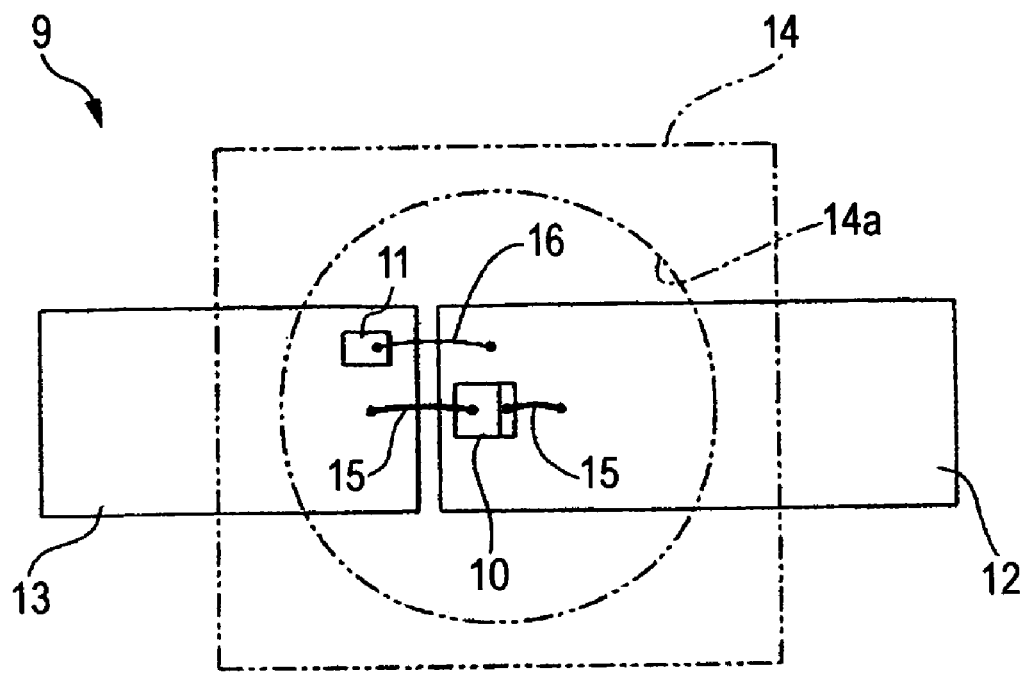
FIG. 3 is a schematic view illustrating an example configuration of a light-emitting device, as viewed along an optical axis.
Figure 4:
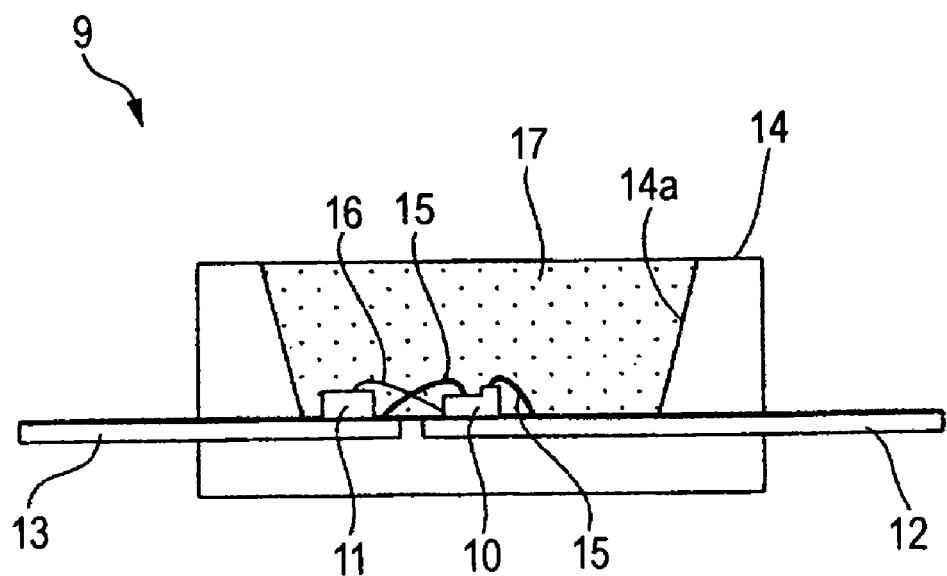
FIG. 4 is another schematic view illustrating the example configuration of the light-emitting device, showing its cross-sectional structure.

FIGS. 3 and 4 are schematic views for explaining an essential portion of an example configuration 9 of the light-emitting device. FIG. 3 is a view as viewed along an optical axis, and FIG. 4 is a view illustrating a cross-sectional structure.

A light-emitting element 10, and an electrostatic protection element 11 for protecting the light-emitting element 10 from an electrostatic breakdown are housed in a single package.

The light-emitting element 10 is mounted on an electrode section 12, and the electrostatic protection element 11 is mounted on an electrode section 13.

As the light-emitting element 10, e.g., a white light-emitting diode using a semiconductor material is employed. However, an infrared-emitting diode, a laser diode, or the like may be employed in accordance with an intended use.

As the electrostatic protection element 11 connected in parallel with the light-emitting element 10 (in the present embodiment, a light-emitting chip), e.g., a Zener diode is employed.

Both the light-emitting element 10 and the electrostatic protection element 11 are located within a recess 14a formed in a housing member 14 in such a state that the light-emitting 10 is mounted on the electrode section 12, and the electrostatic protection element 11 is mounted on the electrode section 13.

The light-emitting element 10 is wired by means of wire bonding with use of connection wire members 15 of gold wire, or the like. For instance, a p-type electrode formed on an LED chip is connected to the electrode section 12 with use of gold wire; and an n-type electrode formed on an LED chip is connected to the electrode section 13 with use of gold wire.

In addition, the electrostatic protection element 11 is configured such that its chip end face (an electrode layer) is fixed to the electrode section 13 with use of silver paste, or the like; and the other end of the chip (an electrode) is connected to the electrode section 12 by means of wire bonding with use of a connection wire member 16, such as gold wire.

A fluorescent material 17 is filled in the recess 14a of the housing member 14. Accordingly, light originating from the light-emitting element 10 is radiated on the fluorescent material, thereby being emitted to the outside by way of an unillustrated, sealing transparent resin section.

A connection wire member for the light-emitting element 10 and that for the electrostatic protection element 11 are formed of the same material. When a diameter of the connection wire member of the electrostatic protection element 11 is denoted by d1, and that of the connection wire member 15 of the light-emitting element 10 is denoted by d2, a relationship of "d1<d2" is satisfied (alternatively, when cross sectional areas of the wire members 15 and 16 are respectively denoted by S15 and S16, a relationship of "S15<S16" is satisfied). More specifically, in a case where "d1=d2" exists, the light-emitting element 10 is in an open-circuit state. In this case, when a current (a rated current, or the like) set for the light-emitting element 10 flows through the electrostatic protection element 11 by way of the connection wire member 16 of the electrostatic protection element 11, breakdown of the element may cause a failure in a short-circuit mode.

To this end, the following measure is desirably taken. That is, the diameter of the connection wire member 16 of the electrostatic protection element 11 is set to a smaller value than that of the connection wire member 15 of the light-emitting element 10, thereby causing the connection wire member 16 of the electrostatic protection element 11 to be fused in a case where an electric current, which is originally intended to flow through the light-emitting element 10, unintentionally flows through the electrostatic protection element 11.

Alternatively, an arrangement in which the connection wire member 16 of the electrostatic protection element 11 and the connection wire member 15 of the light-emitting element 10 are formed of different materials is also conceivable. However, in consideration of problems, such as influences on manufacturing processes and selection of materials, setting the diameter of the connection wire member 16 of the electrostatic protection element 11 to a value smaller than that of the connection wire member 15 of the light-emitting element 10 is easier.

Conditions with regard to the diameters will be described hereinbelow while considering a case using gold wire as the connection wire members 15 and 16 as an example.

Figure 5:
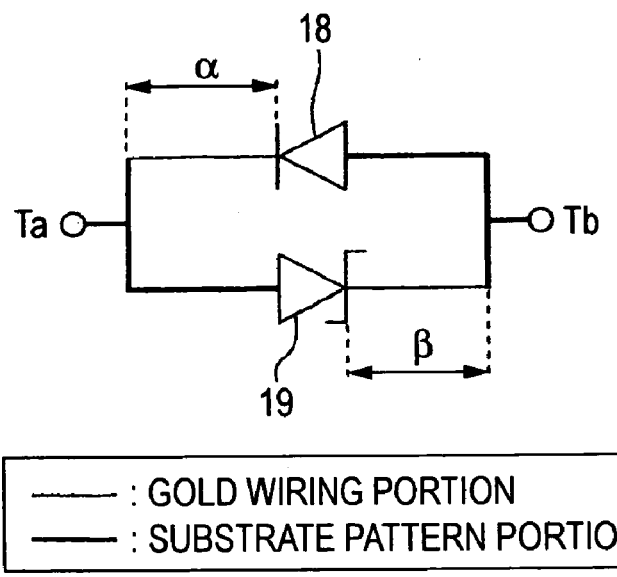
FIG. 5 is a view for explaining diameters of gold wire, showing an equivalent circuit diagram illustrating an example configuration of the light-emitting device.

FIG. 5 is an equivalent circuit diagram illustrating an example configuration of the light-emitting device. In the drawing, an LED chip 18 (indicated by a symbol of a diode) and a Zener diode 19 are connected in parallel.

In the drawing, portions (indicated by thin lines) where wiring is formed with use of gold wire, and pattern portions (indicated by thick lines) of a ceramic substrate are distinguished by the thickness of connection lines. Terminals indicated by Ta and Tb are respectively connected to respective electrode patterns (conductive patterns) of the substrate.

A cathode of the LED chip 18 is connected to, in a range indicated by α, the substrate pattern on the Ta side by means of wire bonding with use of gold wire. Meanwhile, in the present embodiment, an anode of the LED chip 18 is directly connected to a substrate pattern on the Tb side. However, another configuration in which the anode is connected to the substrate pattern on the Tb side by means of wire bonding is also applicable.

A cathode of the Zener diode 19 is connected to, in a range indicated by β, the substrate pattern on the Tb side by means of wire bonding with use of gold wire.

In the present embodiment, in a case where the gold wires for use in the respective ranges of α and β have the same diameter (e.g., each of the gold wires for the two ranges is 35 μm in diameter, and has a current capacity sufficient to allow the rated current of the LED chip to flow), when the LED chip side lapses into an open-circuit mode, an excessive current unintentionally flows through the Zener diode 19. Accordingly, a failure in a short-circuit mode may occur.

To this end, the diameter must be specified to a small value so that only gold wire in the range of β is fused in a case where an overcurrent unintentionally flows through the Zener diode 19. An essential requirement for a case of employing gold wire as the connection wire member is found to be the following: a ratio of the diameter d1 of a connection wire member of an electronic protection element and the diameter d2 of a connection wire member of a light-emitting element satisfies "0<(d1/d2)≦(1/2)."

Figure 6:
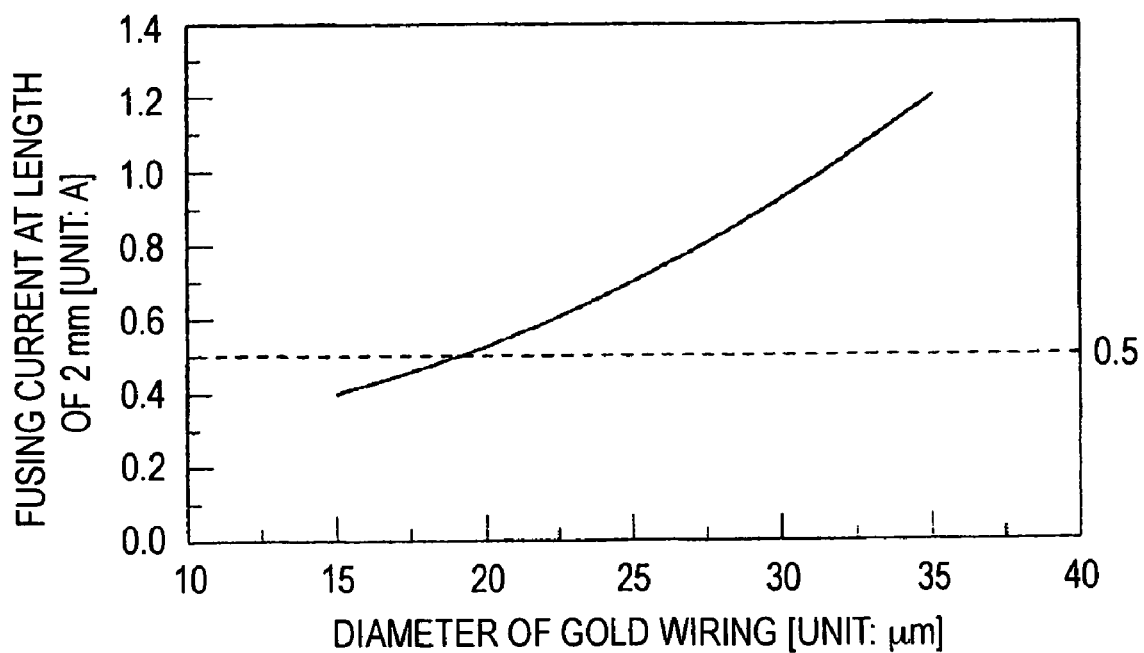
FIG. 6 is another view for explaining the diameters of the gold wire, showing a graph exemplifying a relationship between diameters of the gold wire and their fusing current values.

FIG. 6 is a graph in which an X axis represents diameter of gold wire (unit: μm) which ranges from 15 to 35 μm; and a Y axis represents fusing current values (unit: A) when the gold wire is 2 mm in length.

When the gold wire is 2 mm in length and the rated current value of the LED is 0.5 A, an essential requirement for causing the wire to be fused at the rated current value or lower is to set the diameter to 35/2=17.5 μm or smaller, preferably 15 μm or smaller. More specifically, when the diameter of the gold wire used for the LED chip is 35 μm, by means of setting the diameter of the gold wire used for the Zener diode 19 to one-half thereof or smaller, the gold wire is fused when the rated current of the LED flows. Accordingly, occurrence of the above-described failure in a short-circuit mode can be prevented.

Also, as is apparent from the reason for disposing the Zener diode, a lower limit value of the diameter of the gold wire is determined in consideration of various conditions; the gold wire in the range of β being not fused at a current level on the order of static electricity (that is, a function to be exhibited by the Zener diode is ensured); a wire length; and a usage temperature.

As described above, by means of sufficiently reducing a possibility of occurrence of a failure of a light-emitting device including a light-emitting chip and a Zener diode in a short-circuit mode, nonillumination of the light-emitting device can be detected without fail, thereby ensuring safety during driving when the light-emitting device is applied to a vehicle lamp.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A light-emitting device comprising:
   a light-emitting element and
   an electrostatic protection element for protecting said light-emitting element from electrostatic breakdown,
   wherein said light-emitting element and said electrostatic protection element are connected in parallel,
   wherein a connection wire member of said light-emitting element and a connection wire member of said electrostatic protection element are formed of the same material; and
   wherein said connection wire member of said electrostatic protection element is smaller in diameter than said connection wire member of said light-emitting element.

2. The light-emitting device defined in claim 1, wherein said electrostatic protection element is a Zener diode.

3. The light-emitting device as recited in claim 1, wherein the light-emitting device is connected in series with a plurality of similar light-emitting devices.

4. The light-emitting device defined in claim 1, wherein, in a case where gold wire is employed as said connection wire members, a ratio between d1 and d2 satisfies "$0<(d1/d2)\leq(1/2)$," where a diameter of said connection wire member of said electronic protection element is denoted by d1, and a diameter of said connection wire member of said light-emitting element is denoted by d2.

5. The light-emitting device defined in claim 4, wherein said electrostatic protection element is a Zener diode.

6. A vehicle lamp having a light-emitting device comprising
   a light-emitting element and
   an electrostatic protection element for protecting said light-emitting element from electrostatic breakdown,
   wherein said light-emitting element and said electrostatic protection element are connected in parallel; and
   an optical system for obtaining illumination light by use of said light-emitting device as a light source,
   wherein a connection wire member of said light-emitting element and a connection wire member of said electrostatic protection element are formed of the same material; and
   wherein said connection wire member of said electrostatic protection element is smaller in diameter than said connection wire member of said light-emitting element.

7. The vehicle lamp having the light-emitting device as recited in claim 6, wherein the electrostatic protection element is a Zener diode.

8. The vehicle lamp having the light-emitting device as recited in claim 6, wherein the light-emitting element is an LED.

9. The vehicle lamp having the light-emitting device as recited in claim 6, wherein the illumination light obtained by the optical system by use of said light-emitting device as the light source is reflected.

10. The vehicle lamp having the light-emitting device as recited in claim 6, wherein the light-emitting device is connected in series with a plurality of similar light-emitting devices.

11. The vehicle lamp having the light-emitting device as recited in claim 6, wherein the material is gold wire.

12. The vehicle lamp having the light-emitting device as recited in claim 11, wherein a ratio between d1 and d2 satisfies "$0<(d1/d2)\leq(1/2)$," where the diameter of the connection wire member of the electronic protection element is denoted by d1, and the diameter of the connection wire member of the light-emitting element is denoted by d2.

13. A light-emitting device comprising:
    a light-emitting element, and
    an electrostatic protection element for protecting the light-emitting element from electrostatic breakdown,
    wherein the light-emitting element and the electrostatic protection element are connected in parallel, and
    wherein the electrostatic protection element is fused when the light-emitting element lapses into an open-circuit state.

14. The light-emitting device as recited in claim 13, wherein the electrostatic protection element is a Zener diode.

15. The light-emitting device as recited in claim 13, wherein the light-emitting element is an LED.

16. The light-emitting device as recited in claim 13, wherein the light-emitting device is connected in series with a plurality of similar light-emitting devices.

17. The light-emitting device as recited in claim 13, wherein a connection wire member of the electrostatic protection element and a connection wire member of the light-emitting element are made of the same material.

18. The light-emitting device as recited in claim 17, wherein a diameter of the connection wire member of the electrostatic protection element is smaller than a diameter of the connection wire member of the light-emitting element.

19. The light-emitting device as recited in claim 17, wherein the material is gold wire.

20. The light-emitting device as recited in claim 19, wherein a ratio between d1 and d2 satisfies "$0<(d1/d2)\leq(1/2)$," where a diameter of the connection wire member of the electronic protection element is denoted by d1, and a diameter of the connection wire member of the light-emitting element is denoted by d2.

* * * * *